US012677427B2

(12) United States Patent
Mun et al.

(10) Patent No.: US 12,677,427 B2
(45) Date of Patent: Jul. 7, 2026

(54) ELECTRONIC DEVICE WITH GALVANIC ISOLATION AND INTEGRATION METHODS

(71) Applicant: GlobalFoundries Singapore Pte. Ltd., Singapore (SG)

(72) Inventors: Bong Woong Mun, Singapore (SG); Juan Boon Tan, Singapore (SG); Szu Huat Goh, Singapore (SG); Jeoung Mo Koo, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 924 days.

(21) Appl. No.: 17/659,834

(22) Filed: Apr. 19, 2022

(65) Prior Publication Data

US 2023/0335580 A1     Oct. 19, 2023

(51) Int. Cl.
| | |
|---|---|
| *H10D 1/00* | (2025.01) |
| *H10D 1/68* | (2025.01) |
| *H10W 20/40* | (2026.01) |
| *H10W 44/00* | (2026.01) |
| *H10W 70/05* | (2026.01) |
| *H10W 70/60* | (2026.01) |
| *H10W 70/65* | (2026.01) |
| *H10W 70/685* | (2026.01) |
| *H10W 72/00* | (2026.01) |
| *H10W 74/01* | (2026.01) |

(Continued)

(52) U.S. Cl.
CPC ............. *H10D 1/042* (2025.01); *H10D 1/716* (2025.01); *H10W 20/496* (2026.01); *H10W 44/601* (2026.01); *H10W 70/05* (2026.01);

*H10W 70/095* (2026.01); *H10W 70/611* (2026.01); *H10W 70/65* (2026.01); *H10W 70/685* (2026.01); *H10W 72/00* (2026.01); *H10W 74/016* (2026.01); *H10W 74/117* (2026.01); *H10W 90/00* (2026.01); *H10W 90/701* (2026.01); *H10W 70/635* (2026.01); *H10W 90/293* (2026.01)

(58) Field of Classification Search
CPC ... H10D 1/042; H01L 25/0655; H01L 25/115; H01L 25/0753; H01L 25/072; H01L 2924/19041; H01L 23/50; H01L 2924/19105

See application file for complete search history.

(56) References Cited

U.S. PATENT DOCUMENTS

| | | | | |
|---|---|---|---|---|
| 7,327,554 B2 * | 2/2008 | Otsuka | ................. | H05K 1/0231 |
| | | | | 257/E23.079 |
| 7,605,458 B1 * | 10/2009 | Rahman | .............. | H01L 25/0657 |
| | | | | 257/774 |

(Continued)

*Primary Examiner* — Britt Hanley
*Assistant Examiner* — Victor V Barzykin
(74) *Attorney, Agent, or Firm* — Francois Pagette

(57) ABSTRACT

An electronic device is provided, the device comprising an interposer including a dielectric material and an interconnect structure. An integrated circuit chip may be arranged over the interposer. A galvanic capacitor may be spaced from the integrated circuit chip. The galvanic capacitor having a first electrode and a second electrode. The first electrode of the galvanic capacitor may be coupled to the integrated circuit chip. A molding material may be arranged over the integrated circuit chip and the galvanic capacitor, whereby the integrated circuit chip may be spaced from the galvanic capacitor by at least a portion of the molding material.

17 Claims, 12 Drawing Sheets

(51) Int. Cl.
    *H10W 74/10*          (2026.01)
    *H10W 90/00*          (2026.01)
    *H10W 70/63*          (2026.01)
    *H10W 90/20*          (2026.01)

(56)                References Cited

U.S. PATENT DOCUMENTS

| | | | |
|---|---|---|---|
| 8,385,043 | B2 | 2/2013 | Ng et al. |
| 8,592,944 | B2 | 11/2013 | Satangelo et al. |
| 8,659,149 | B2 | 2/2014 | French et al. |
| 8,822,268 | B1 | 9/2014 | Magnus |
| 8,921,988 | B2 | 12/2014 | Hsu et al. |
| 8,957,500 | B2 | 2/2015 | Dubois et al. |
| 9,257,834 | B1 | 2/2016 | Moghe et al. |
| 9,748,207 | B2 | 8/2017 | Krause et al. |
| 10,594,162 | B2 | 3/2020 | Bhamidipati et al. |
| 2016/0358848 | A1* | 12/2016 | Meyer .................... H01L 25/16 |

* cited by examiner

ELECTRONIC DEVICE WITH GALVANIC ISOLATION AND INTEGRATION METHODS

FIELD OF THE INVENTION

The disclosed embodiments relate generally to semiconductor electronic devices, and more particularly, to semiconductor electronic devices with galvanic isolation and integration methods.

BACKGROUND

Galvanic isolation refers to an isolation that prevents direct current and unwanted alternating current between two parts of a system while still enabling signal and power transfer between those two parts. For example, alternating current within a defined frequency range may flow between a first circuit and a second circuit, direct current and high-speed alternating current transients are prevented from flowing between the two circuits. Galvanic isolation may be achieved by electrically isolating the first circuit from the second circuit.

However, the integration of galvanic isolation capability in semiconductor electronic devices is challenging due to chip area constraints and process complexities. Thereby, there is a need for an improved electronic device with galvanic isolation and integration methods to overcome the challenges mentioned above.

SUMMARY

In an aspect of the present disclosure, an electronic device is provided, the device comprising an interposer having a dielectric material and an interconnect structure. An integrated circuit chip may be arranged over the interposer. A galvanic capacitor having a first electrode and a second electrode. The first electrode of the galvanic capacitor may be coupled to the integrated circuit chip. A molding material may be arranged over the integrated circuit chip and the galvanic capacitor, whereby the integrated circuit chip may be spaced from the galvanic capacitor by at least a portion of the molding material.

In another aspect of the present disclosure, an electronic device is provided, the device comprising an interposer having a dielectric material and an interconnect structure. An integrated circuit chip may be arranged over the interposer. A galvanic capacitor may be laterally spaced from the integrated circuit chip. The galvanic capacitor may have a first electrode and a second electrode. The first electrode of the galvanic capacitor may be electrically coupled to the integrated circuit chip. A molding material may be arranged over the integrated circuit chip and the galvanic capacitor. The integrated circuit chip may be spaced from the galvanic capacitor by at least a portion of the molding material.

In yet another aspect of the present disclosure, a method of fabricating an electronic device may be provided. The method comprising forming a molding material over an integrated circuit chip. A galvanic capacitor may be formed, the galvanic capacitor having a first electrode and a second electrode. The first electrode of the galvanic capacitor may be coupled to the integrated circuit chip. The galvanic capacitor may be spaced from the integrated circuit chip by at least a portion of the molding material. An interposer including a dielectric material and an interconnect structure may be formed. The interposer may be arranged below the integrated circuit chip.

BRIEF DESCRIPTION OF THE DRAWINGS

The disclosed embodiments will be better understood from a reading of the following detailed description, taken in conjunction with the accompanying drawings.

DETAILED DESCRIPTION

The following detailed description is exemplary in nature and is not intended to limit the devices or the application and uses of the devices. Furthermore, there is no intention to be bound by any theory presented in the preceding background of the devices or the following detailed description.

Figures 1, 2:
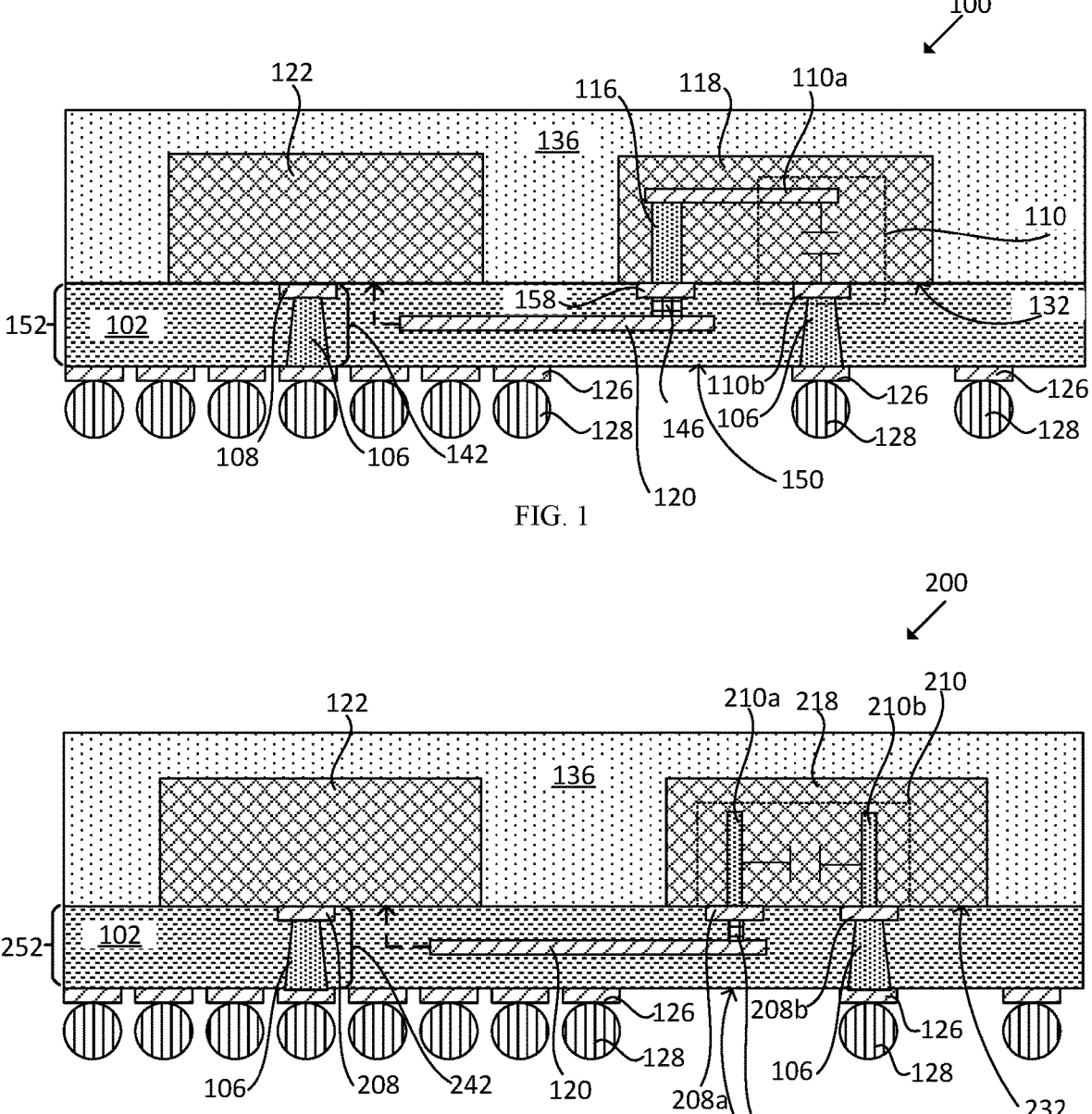
FIG. 1 shows an electronic device, according to an embodiment of the disclosure.
FIG. 2 shows an electronic device, according to another embodiment of the disclosure.

FIG. 1 shows an electronic device 100, according to an embodiment of the disclosure. In one embodiment, the electronic device 100 may be a fan-out package. The term "fan-out package" may refer to a package where input/output connections on a die surface within the package are distributed in an outward direction from the die surface through interconnections, for example, interconnect metals, vias and lines to package level input/output connections meant to be connected to external circuitry. The package may allow more external input/output connections as the area for input/output connections is not limited to and may extend beyond the die surface. An example of package level input/output connections may be package contacts 128. The electronic device 100 may include a first chip 122 and a second chip 118 laterally spaced from the first chip 122. The first chip 122 may be an integrated circuit chip having an electronic circuit, for example, a power integrated circuit or any other suitable electronic circuits. The second chip 118 may include at least a portion of a galvanic capacitor 110. The galvanic capacitor 110 may include a first electrode and a second electrode below the first electrode. An insulating material (not shown for simplicity) may be arranged between the first and second electrodes. The first electrode may be electrically coupled to the first chip 122. A molding material 136 may be arranged over the first chip 122 and the galvanic capacitor 110. The first chip 122 may be spaced from the galvanic capacitor 110 by at least a portion of the molding material 136.

An interposer 152 may be arranged below the first chip 122 and the molding material 136. The interposer 152 may include an interconnect structure 142 and a dielectric material 102. The dielectric material 102 may include one or more layers. A plurality of package contacts 128 may be arranged below the dielectric material 102. The package contacts 128 may be solder balls, pillar bumps or any other suitable package contacts. One of the package contacts 128 may be electrically coupled to the second electrode.

In one embodiment, the first electrode may be a first conductive plate 110a and the second electrode may be a second conductive plate 110b. The second conductive plate 110b may be arranged below the first conductive plate 110a and at least partially underlapping the first conductive plate 110a. The first conductive plate 110a may be arranged in the second chip 118. The second conductive plate 110b may be arranged in the dielectric material 102. The capacitor 110 has increased breakdown voltage due to large separation between the first 110a and second 110b conductive plates. An interconnect pillar 116 may connect the first conductive plate 110a to a bottom surface 132 of the second chip 118. The bottom surface 132 may be the surface where electrical connections are located. An example of the electrical connections may be the interconnect pillar 116. In one embodiment, an interconnect part 158 may be arranged in the dielectric material 102 and in direct contact with the interconnect pillar 116. The interconnect part 158 may also be coupled to an interconnect feature 146. An interconnect line 120 may be arranged in the dielectric material 102 and electrically couples the interconnect pillar 116, interconnect feature 146 and the first chip 122. A dashed arrow indicates the electrical coupling between the interconnect line 120 and the first chip 122.

An interconnect via 106 in the dielectric material 102 of the interposer 152 may be arranged below the second conductive plate 110b. In one embodiment, the interconnect via 106 may be in direct contact with the second conductive plate 110b. The interconnect via 106 may form part of the interconnect structure 142 of the interposer 152. The interconnect structure 142 may also include the interconnect feature 146, interconnect part 158, interconnect line 120 and interconnect metals 108. For example, the interconnect structure 142 may also include a redistribution layer. The term "redistribution layer" may refer to interconnects that electrically couple one part of a semiconductor package to another.

A plurality of bond pads 126 may be arranged on the bottom surface of the dielectric material 102. The bond pads 126 may be arranged below and spaced from the first 122 and second 118 chips. The interconnect structure 142, for example, the interconnect metals 108 and interconnect vias 106, may electrically couple the bond pads 106 and the first chip 122. The interconnect via 106 may also couple the second conductive plate 110b to the bond pad 126 and package contact 128. In one embodiment, the interconnect structure 142 and the bond pads 126 may be distributed over an area larger than an area of the first 122 and second 118 chips.

The embodiments shown in FIG. 1 may be modified to form alternative embodiments without departing from the scope of the disclosure. For example, FIG. 2 shows an electronic device 200, according to another embodiment of the disclosure. Like features in FIG. 1 may be indicated by like numerals in FIG. 2. In contrast to the electronic device 100 shown in FIG. 1, the electronic device 200 includes a galvanic capacitor 210 arranged on the interposer 252. The galvanic capacitor 210 may have a first and second electrodes, whereby the first electrode may be a first via bar 210a and the second electrode may be a second via bar 210b. The first via bar 210a and the second via bar 210b may be arranged vertically and the first via bar 210a may be laterally spaced from the second via bar 210b. The first via bar 210a and the second via bar 210b may extend to a bottom surface 232 of the second chip 218. The bottom surface 232 may be arranged on a top surface of the interposer 252, for example, directly on the top surface of the dielectric material 102. The first via bar 210a may be arranged over an interconnect metal 208a in the dielectric material 102. In one embodiment, an interconnect line 120 may be arranged below and electrically coupled to the interconnect metal 208a by an interconnect feature 246. The interconnect line 120 may electrically couple the first via bar 210a to the first chip 122. A dashed arrow indicates the electrical coupling between the interconnect line 120 and the first chip 122. In an alternative embodiment, the first via bar 210a may be in direct contact with the interconnect line 120. The second via bar 210b may be arranged over an interconnect metal 208b in the dielectric material 102. The interconnect metal 208b may be electrically coupled to a bond pad 126 and a package contact 128 by an interconnect via 106. The interconnect metals 208a and 208b, interconnect vias 106 and interconnect feature 246 may be part of an interconnect structure 242.

Figures 3, 4:
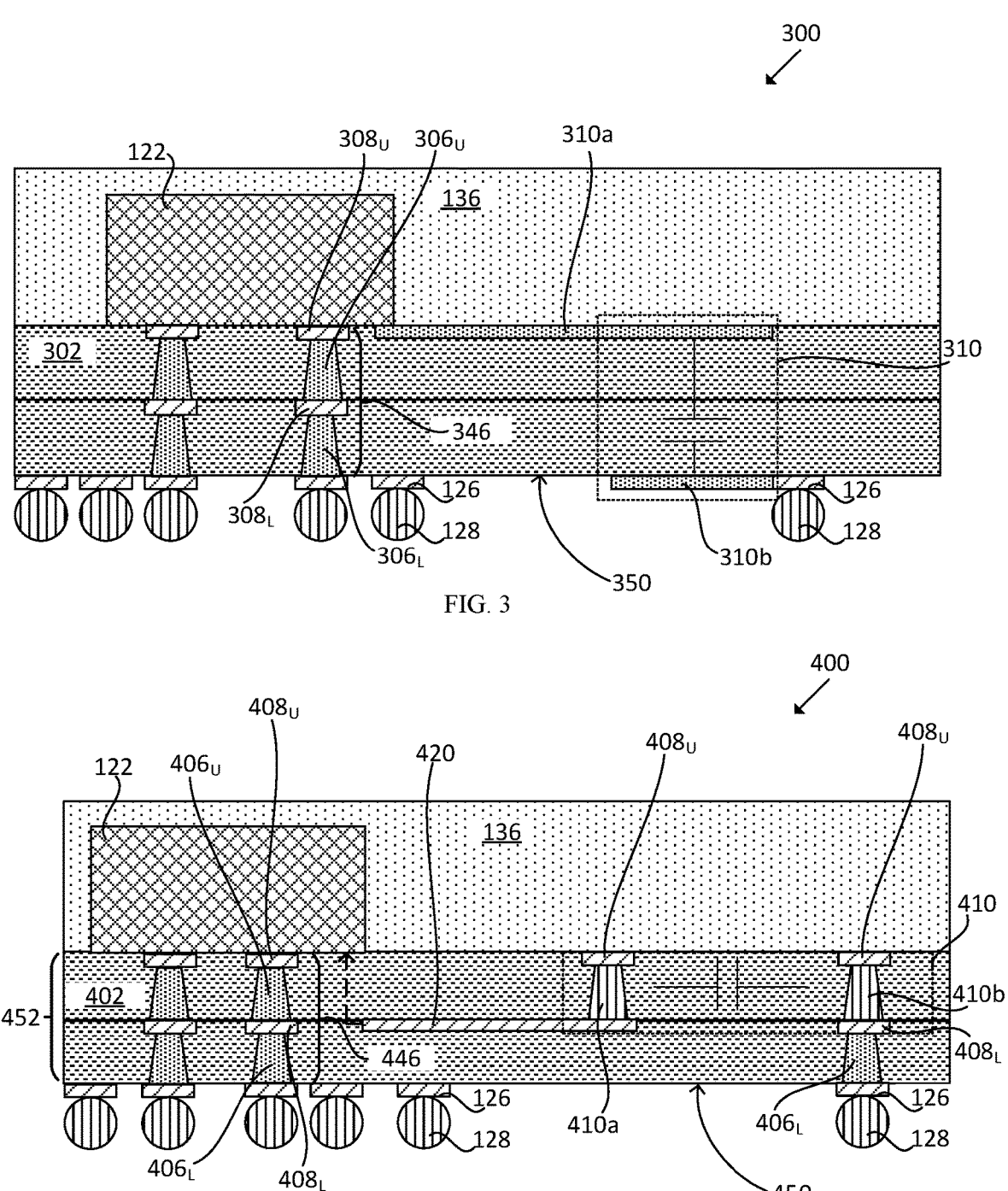
FIG. 3 shows an electronic device, according to yet another embodiment of the disclosure.
FIG. 4 shows an electronic device, according to yet another embodiment of the disclosure.

FIG. 3 shows an electronic device 300, according to yet another embodiment of the disclosure. Like features in FIG. 1 may be indicated by like numerals in FIG. 3. In contrast to the electronic device 100 shown in FIG. 1, the electronic device 300 includes a galvanic capacitor 310 arranged below the molding material 136. The galvanic capacitor 310 may be arranged at least partially in a dielectric material 302. The dielectric material 302 may have one or more layers. In one embodiment, a dielectric liner 342 (not shown for simplicity), may be arranged between the dielectric material 302 layers. The dielectric liner 342 may be an etch stop layer or a chemical mechanical planarization process stop layer. A first electrode of the galvanic capacitor 310 may be a first conductive plate 310a. A second electrode of the galvanic capacitor 310 may be a second conductive plate 310b. The second conductive plate 310b may be arranged below the first conductive plate 310a and at least partially underlapping the first conductive plate 310a. The first conductive plate 310a may be arranged in the dielectric material 302 and electrically coupled with the first chip 122. The second conductive plate 310b may be arranged below the dielectric material 302.

A bond pad 126 may be arranged between the dielectric material 302 and a package contact 128. The bond pad 126 may be laterally adjacent and electrically coupled to the second conductive plate 310b. In one embodiment, the bond pad 126 may be diagonally spaced from the first conductive plate 310a to reduce capacitive coupling to the first conductive plate 310a. The electronic device 300 may also include an interconnect structure 346 in the dielectric material 302. In one embodiment, the interconnect structure 346 may include upper interconnect metals 308u arranged below the first chip 122. The upper interconnect metals 308u may be laterally spaced from the first conductive plate 310a. Upper interconnect vias 306u may be arranged below the upper interconnect metals 308*u*. Lower interconnect metals 308L may be arranged below the upper interconnect vias 306*u*. Lower interconnect vias 306L may be arranged below the lower interconnect metals 308L. The interconnect structure 346 may electrically couple the first chip 122 to the bond pads 126 and package contacts 128. In one embodiment, the second conductive plate 310*b* may be laterally spaced from bond pads 126 coupled to the lower interconnect vias 306L. In an alternative embodiment, the interconnect structure 346 may include additional stacks of interconnect metals and interconnect vias. The interconnect structure 346 below the first chip 122 may be laterally spaced from the galvanic capacitor 310.

FIG. 4 shows an electronic device 400, according to yet another embodiment of the disclosure. Like features in FIG. 1 may be indicated by like numerals in FIG. 4. In contrast to the electronic device 300, the electronic device 400 includes a galvanic capacitor 410 having electrodes as via bars. The galvanic capacitor 410 may be spaced from the first chip 122 and arranged below the molding material 136. A first electrode of the galvanic capacitor 410 may be a first via bar 410*a* and a second electrode of the galvanic capacitor 410 may be a second via bar 410*b*. The first via bar 410*a* and the second via bar 410*b* may be arranged vertically and the first via bar 410*a* may be laterally spaced from the second via bar 410*b*. In one embodiment, an upper interconnect metal 408*u* may be arranged between the molding material 136 and the first via bar 410*a*. In one embodiment, another upper interconnect metal 408*u* may be arranged between the molding material 136 and the second via bar 410*b*. The first 410*a* and second 410*b* via bars may be arranged in an interposer 452. The interposer 452 may include a dielectric material 402 and interconnect line 420. The dielectric material 402 may have one or more layers. The interconnect line 420 in the dielectric material 402 may electrically couple the first via bar 410*a* to the first chip 122. A dashed arrow indicates the electrical coupling between the interconnect line 420 and the first chip 122. The second via bar 410*b* may be electrically coupled to a bond pad 126 and a package contact 128 arranged below the dielectric material 402. In one embodiment, a lower interconnect metal 408L and a lower interconnect via 406L may couple the second via bar 410*b* to the bond pad 126. The interposer 452 may also include an interconnect structure 446. The interconnect structure 446 may be arranged below the first chip 122 and the galvanic capacitor 410 may be laterally spaced from the interconnect structure 446. The interconnect structure 446 may include an upper interconnect metal 408*u* and an upper interconnect via 406*u* below the upper interconnect metal 408*u*. A lower interconnect metal 408L may be arranged below the upper interconnect via 406*u* and a lower interconnect via 406L arranged below the lower interconnect metal 408L. In one embodiment, the first via bar 410*a* may be laterally spaced from the upper interconnect via 406*u*.

Figure 5:
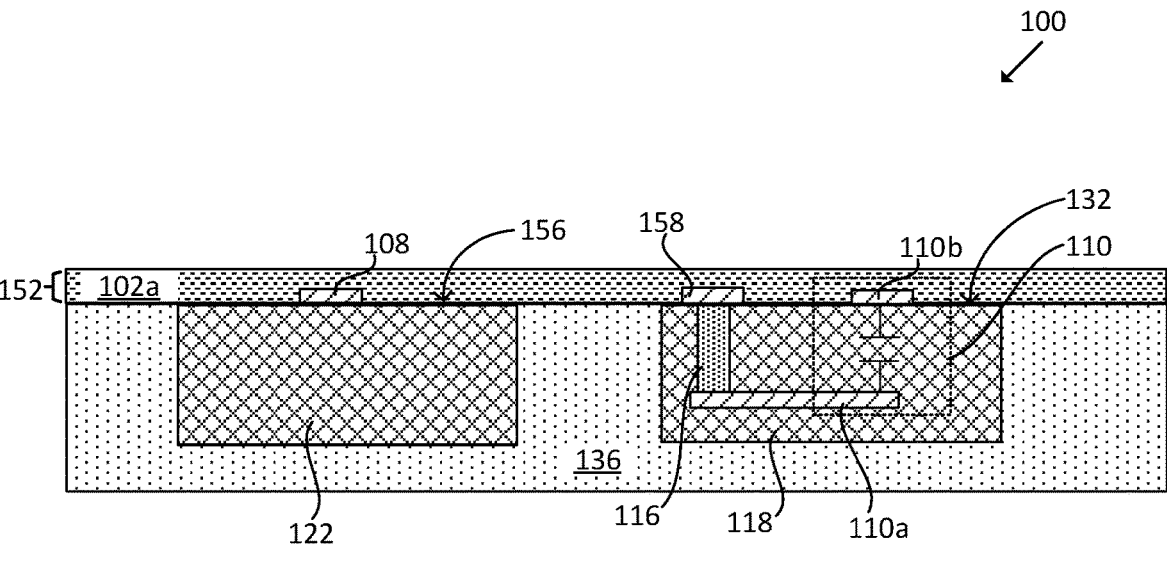
FIGS. 5 to 10 show a fabrication process flow for the electronic device shown in FIG. 1, according to some embodiments of the disclosure.

FIGS. 5 to 10 show a fabrication process flow for the electronic device 100 shown in FIG. 1, according to some embodiments of the disclosure. FIG. 5 shows an electronic device 100 at an exemplary processing step, for example, after the formation of a molding material 136 over a first 122 and second 118 chips, interconnect metal 108, interconnect part 158, a second electrode 110*b* of a galvanic capacitor 110 and a first layer of dielectric material 102*a*, according to an embodiment of the disclosure. Referring to FIG. 5, a first chip 122 and a second chip 118 may be provided. The first chip 122 may include an electronic circuit, for example, a power integrated circuit or any other suitable electronic circuits. The second chip 118 may include at least a portion of a galvanic capacitor 110 with a first conductive plate 110*a* and an interconnect pillar 116 coupled to the first electrode 110*a*. An adhesive surface, for example, a tape or a carrier may be attached to bottom surfaces 156 and 132 of the first 122 and second 118 chips, respectively. A molding compound resin may be deposited over side and upper surfaces of the first 122 and second 118 chips to form a molding material 136. The tape may subsequently be removed from the first 122 and second 118 chips and the molding material 136. The bottom surfaces 156 and 132 of the first 122 and second 118 chips, respectively, and the molding material 136 are shown as facing up in FIGS. 5 to 10. An interposer 152 may be formed over the bottom surfaces 156 and 132 of the first 122 and second 118 chips, respectively, and the molding material 136. The interposer 152 may at least include a first layer of dielectric material 102*a*, an interconnect part 158, and an interconnect metal 108. The interconnect metal 108, interconnect part 158, and second conductive plate 110*b* may be formed by depositing a layer of a suitable metal, for example, titanium nitride, aluminum, copper, or any other suitable metal over the bottom surfaces 156 and 132 of the first 122 and second 118 chips, respectively, and the molding material 136. The titanium nitride layer may be deposited by a suitable deposition process, for example, atomic layer deposition, chemical vapor deposition, physical vapor deposition, or any other suitable deposition processes. The titanium nitride layer may be patterned by a material removal process. A layer of photoresist may be deposited on the titanium nitride layer followed by exposure and developing to form suitable photoresist patterns. A wet or dry etch process may be used to remove a portion of the titanium nitride layer not covered by the photoresist patterns, leaving behind another portion of the titanium nitride layer under the photoresist patterns. The photoresist patterns may subsequently be removed. A layer of a suitable dielectric, for example, silicon dioxide, silicon nitride, or any other suitable dielectric may be deposited over the interconnect metal 108, interconnect part 158, second conductive plate 110*b*, bottom surfaces 156 and 132 of the first 122 and second 118 chips, respectively, and the molding material 136. A suitable planarization process, for example, chemical mechanical planarization, may be used to planarize the silicon dioxide thereby forming the first layer of dielectric material 102*a*.

Figure 6:
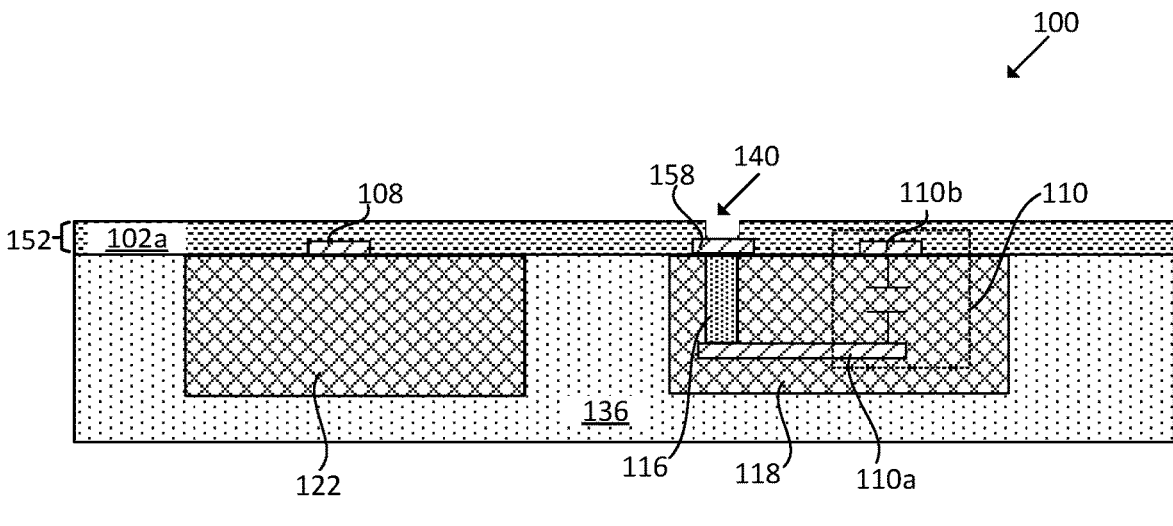

FIG. 6 shows an electronic device 100 at a subsequent processing step, after the formation of an opening 140 in the first layer of dielectric material 102*a*, according to an embodiment of the disclosure. Referring to FIG. 6, the formation of the opening 140 may include a material removal process. A layer of photoresist may be deposited over the first layer of dielectric material 102*a*, exposed and developed to form suitable photoresist patterns. A wet etch or dry etch process may be used to remove a portion of the first layer of dielectric material 102*a* not covered by the photoresist patterns to form the opening 140, leaving behind another portion of the first layer of dielectric material 102*a* under the photoresist patterns. The opening 140 may expose a portion of the interconnect part 158. The photoresist patterns may subsequently be removed.

Figure 7:
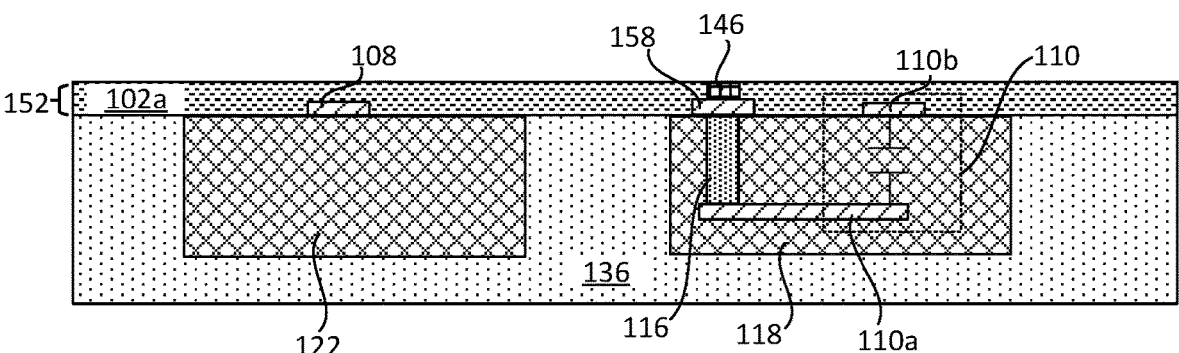

FIG. 7 shows an electronic device 100 at a subsequent processing step, after the formation of an interconnect feature 146, according to an embodiment of the disclosure. The interconnect feature 146 may form part of the interposer 152. The formation of the interconnect feature 146 may include depositing a layer of a suitable metal, for example, tungsten, aluminum, copper, or any other suitable metal in the opening 140. The tungsten layer may be deposited by atomic layer deposition, physical vapor deposition, chemical vapor deposition, electroplating, or any other suitable deposition processes. A suitable planarization process, for example, chemical mechanical planarization, may be used to remove a portion of the tungsten layer from a top surface of the first layer of dielectric material 102a, leaving behind another portion of the tungsten layer in the opening 140.

Figure 8:
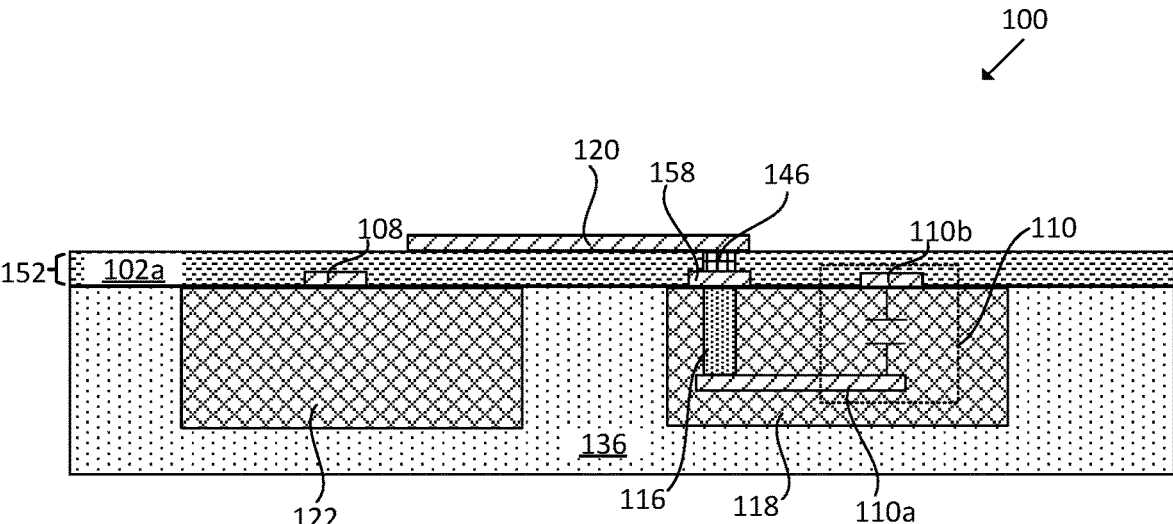

FIG. 8 shows an electronic device 100 at a subsequent processing step, after the formation of an interconnect line 120, according to an embodiment of the disclosure. The interconnect line 120 may also form part of the interposer 152. The formation of the interconnect line 120 may include depositing a layer of a suitable metal, for example, titanium nitride, aluminum, copper, or any other suitable metal on the top surface of the first layer of dielectric material 102a and over the interconnect feature 146. The titanium nitride layer may be patterned by a material removal process to form the interconnect line 120. A layer of photoresist may be deposited on the titanium nitride layer. The photoresist layer may be exposed and developed to form suitable photoresist patterns. A wet or dry etch process may be used to remove a portion of the titanium nitride layer not covered by the photoresist patterns, leaving behind another portion of the titanium nitride layer under the photoresist patterns. The photoresist patterns may subsequently be removed.

Figure 9:
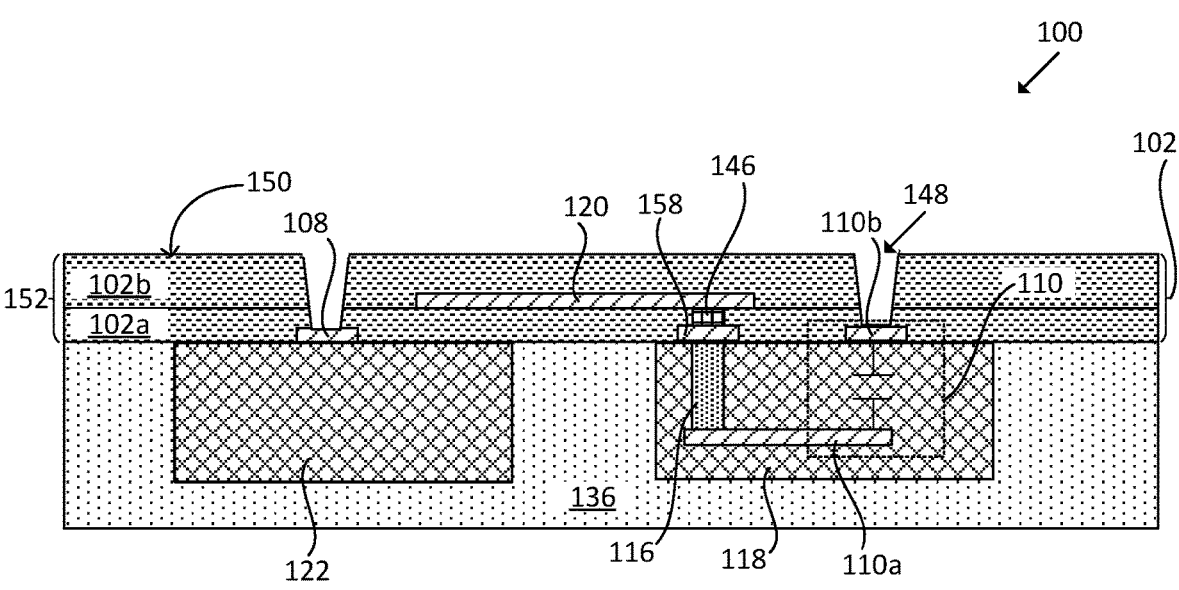

FIG. 9 shows an electronic device 100 at a subsequent processing step, after the formation of a second layer of dielectric material 102b and an opening 148, according to an embodiment of the disclosure. A layer of a suitable dielectric, for example, silicon dioxide, silicon nitride, or any other suitable dielectric may be deposited over the first layer of dielectric material 102a and the interconnect line 120. A suitable planarization process, for example, chemical mechanical planarization, may be used to planarize a surface 150 of the second layer of dielectric material 102b. The first 102a and second 102b layers of dielectric material may be referred to as dielectric material 102. The second layer of dielectric material 102b may form part of the interposer 152. An opening 148 may be made in the dielectric material 102 to expose a portion of the second conductive plate 110b. Another opening may be made in the dielectric material 102 to expose a portion of the interconnect metal 108 on the first chip 122. The formation of the openings may include a material removal process. A layer of photoresist may be deposited on the surface 150 of the dielectric material 102. The photoresist layer may be exposed and developed to form suitable photoresist patterns. A wet etch or dry etch process may be used to remove a portion of the dielectric material 102 not covered by the photoresist patterns to form the openings, leaving behind another portion of the dielectric material 102 under the photoresist patterns. The photoresist patterns may subsequently be removed.

Figure 10:
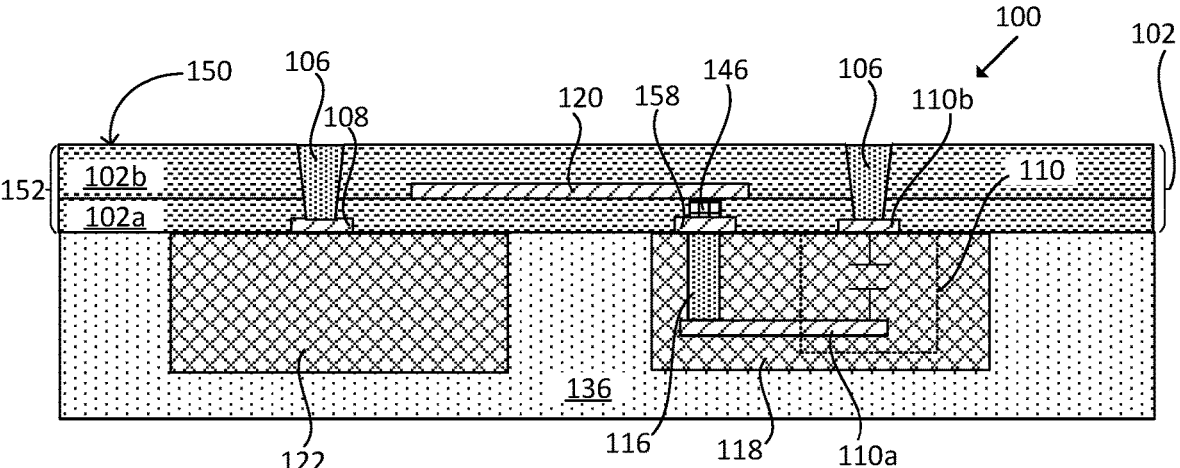

FIG. 10 shows an electronic device 100 at a subsequent processing step, after the formation of interconnect vias 106, according to an embodiment of the disclosure. The interconnect vias 106 may form part of the interposer 152. A layer of a suitable metal, for example, tungsten, aluminum, copper, or any other suitable metal may be deposited in the openings in the dielectric material 102. A suitable planarization process, for example, chemical mechanical planarization, may be used to remove a portion of the tungsten layer from the surface 150 of the dielectric material 102, leaving behind another portion of the tungsten layer in the openings.

The fabrication process may continue to form the electronic device 100 as shown in FIG. 1. The electronic device 100 is flipped and the surface 150 of the dielectric material 102 is shown as facing down in FIG. 1. To form the electronic device 100 shown in FIG. 1, bond pads 126 may be formed on the surface 150 of the dielectric material 102 and below the interconnect vias 106. A layer of a suitable metal, for example, titanium nitride, aluminum, copper, or any other suitable metal may be deposited on the surface 150 of the dielectric material 102. The titanium nitride layer may be patterned by a material removal process. A layer of photoresist may be deposited on the titanium nitride layer. The photoresist layer may be exposed and developed to form suitable photoresist patterns. A wet etch or dry etch process may be used to remove a portion of the titanium nitride layer not covered by the photoresist patterns, leaving behind another portion of the titanium nitride layer under the photoresist patterns. The photoresist patterns may subsequently be removed. Package contacts 128 may be formed and arranged on the bond pads 126.

Figure 11:
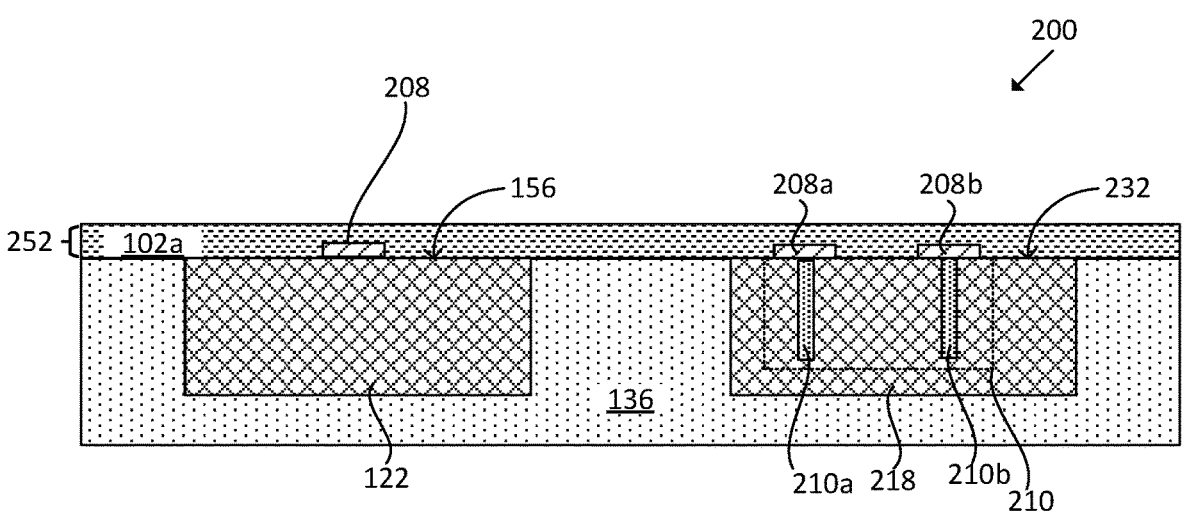
FIGS. 11 to 14 show a fabrication process flow for the electronic device shown in FIG. 2, according to some embodiments of the disclosure.

FIGS. 11 to 14 show a fabrication process flow for the electronic device 200 shown in FIG. 2, according to some embodiments of the disclosure. FIG. 11 shows an electronic device 200 at an exemplary processing step, for example, after the formation of a molding material 136, interconnect metals 208, 208a and 208b, and a first layer of dielectric material 102a, according to an embodiment of the disclosure. Referring to FIG. 11, a first chip 122 and a second chip 218 may be provided. The second chip 218 may include a galvanic capacitor 210 having a first 210a and second 210b via bars. Bottom surfaces 156 and 232 of the first 122 and second 218 chips, respectively, may be attached to a tape. The bottom surfaces 156 and 232 are shown as facing up in FIGS. 11 to 14. Additionally, the bottom surfaces 156 and 232 may refer to the surfaces where electrical connections are located. Examples of electrical connections may be the first 210a and second 210b via bars. A molding material 136 may be formed over the side and upper surfaces of the first 122 and second 218 chips. The tape may be subsequently removed to expose the bottom surfaces 156 and 232 of the first 122 and second 218 chips, respectively, and the molding material 136.

An interposer 252 may be formed over the bottom surfaces 156 and 232 of the first 122 and second 218 chips, respectively. The interposer 252 may also be formed over the bottom surface of the molding material 136. The interposer 252 may include at least the first layer of dielectric material 102a and interconnect metals 208, 208a and 208b. The interconnect metal 208 may be formed on the bottom surface 156 of the first chip 122 and interconnect metals 208a and 208b may be formed on the bottom surface 232 of the second chip 218. The interconnect metal 208a may be formed on the first via bar 210a and the interconnect metal 208b may be formed on the second via bar 210b. The formation of the interconnect metals 208, 208a and 208b may include depositing a layer of a suitable metal, for example, titanium nitride, aluminum, copper, or any other suitable metal over the bottom surfaces 156 and 232 of the first 122 and second 218 chips, respectively, and the molding material 136. The titanium nitride layer may be patterned by a material removal process. A layer of photoresist may be deposited on the titanium nitride layer. The photoresist layer may be exposed and developed to form suitable photoresist patterns. A wet etch or dry etch process may be used to remove a portion of the titanium nitride layer not covered by the photoresist patterns, leaving behind another portion of the titanium nitride layer under the photoresist patterns. The photoresist patterns may subsequently be removed. The first layer of dielectric material 102a may be formed on the bottom surface of the molding material 136, the bottom surfaces 156 and 232 of the first 122 and second 218 chips, respectively, and on the interconnect metals 208, 208a and 208b. The formation of the first layer of dielectric material 102a of the electronic device 200 may be like the formation of the first layer of dielectric material 102a of the electronic device 100 shown in FIG. 5 except that the first layer of dielectric material 102a is formed on the bottom surface 232 of the second chip 218 and on the interconnect metals 208, 208a and 208b.

Figure 12:
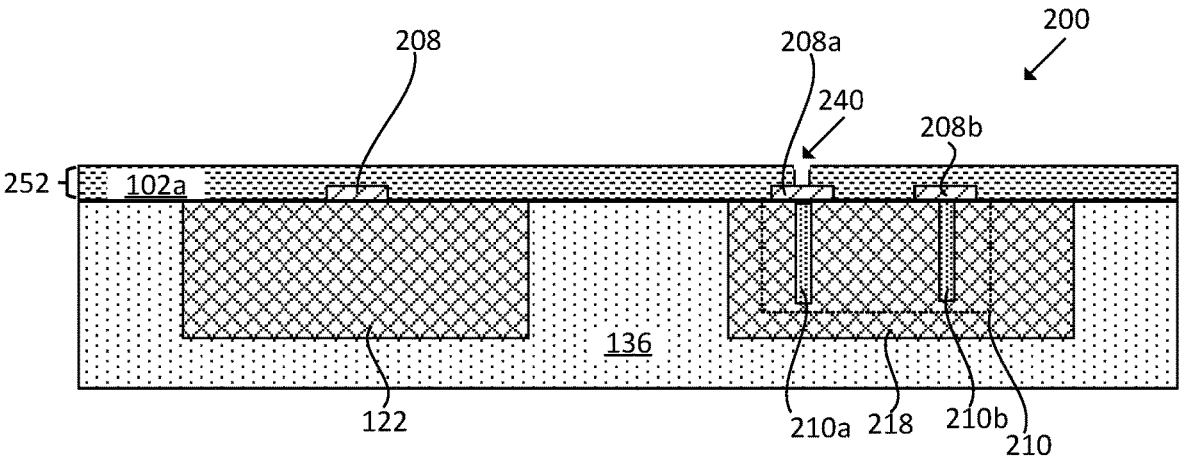

FIG. 12 shows an electronic device 200 at a subsequent processing step, after the formation of an opening 240 in the first layer of dielectric material 102a, according to an embodiment of the disclosure. The opening 240 may be made by a material removal process. A layer of photoresist may be deposited on the top surface of the first layer of dielectric material 102a. The photoresist layer may be exposed and developed to form suitable photoresist patterns. A wet etch or dry etch process may be used to remove a portion of the first layer of dielectric material 102a not covered by the photoresist patterns to form the opening 240. The opening 240 may expose a portion of the interconnect metal 208a. The etch processes may leave behind another portion of the first layer of dielectric material 102a under the photoresist patterns. The photoresist patterns may subsequently be removed.

Figure 13:
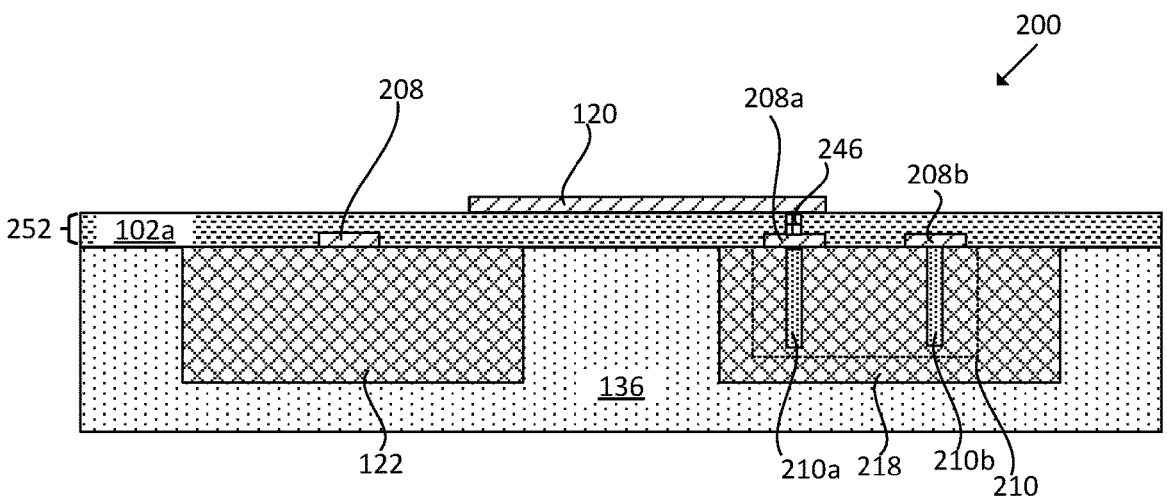

FIG. 13 shows an electronic device 200 at a subsequent processing step, after the formation of an interconnect feature 246 and an interconnect line 120, according to an embodiment of the disclosure. The interconnect feature 246 and interconnect line 120 may form part of the interposer 252. The interconnect feature 246 may be formed in the opening 240 and on the interconnect metal 208a. A layer of a suitable metal, for example, tungsten, aluminum, copper, or any other suitable metal may be deposited in the opening 240. A suitable planarization process, for example, chemical mechanical planarization, may be used to remove a portion of the tungsten layer from a top surface of the first layer of dielectric material 102a, leaving behind another portion of the tungsten layer in the opening 240. The interconnect line 120 may be formed over the interconnect feature 246 and over the top surface of the first layer of dielectric material 102a. A layer of a suitable metal, for example, titanium nitride, aluminum, copper, or any other suitable metal may be deposited over the interconnect feature 246 and the top surface of the first layer of dielectric material 102a. The titanium nitride layer may be patterned by a material removal process. A layer of photoresist may be deposited on the titanium nitride layer and subsequently exposed and developed to form suitable photoresist patterns. A wet etch or dry etch process may be used to remove a portion of the titanium nitride layer not covered by the photoresist patterns, leaving behind another portion of the titanium nitride layer under the photoresist patterns. The photoresist patterns may subsequently be removed.

Figure 14:
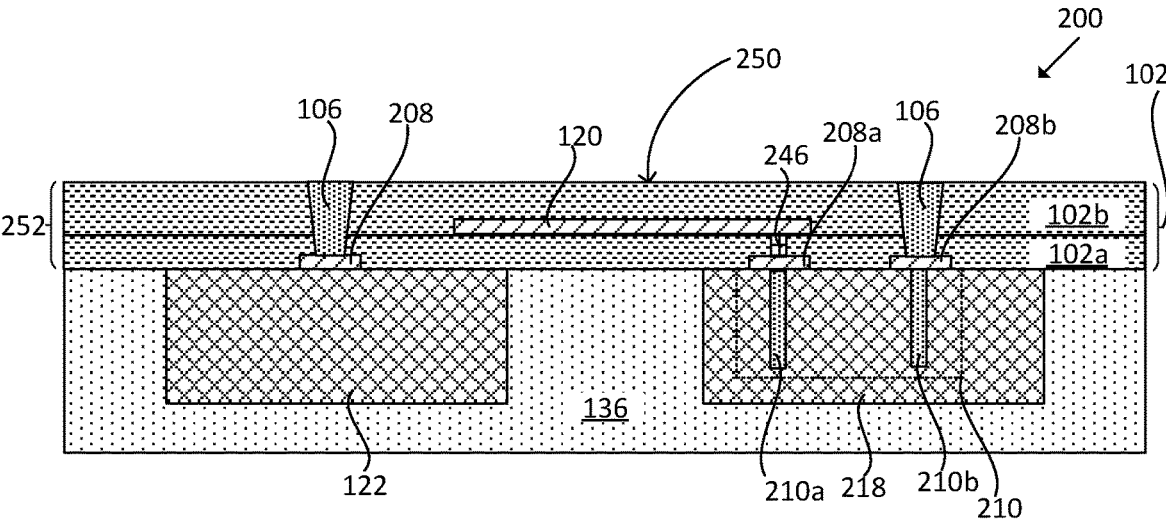

FIG. 14 shows an electronic device 200 at a subsequent processing step, after the formation of a second layer of dielectric material 102b and interconnect vias 106, according to an embodiment of the disclosure. The second layer of dielectric material 102b and interconnect vias 106 may also form part of the interposer 252. A layer of a suitable dielectric, for example, silicon dioxide, silicon nitride, or any other suitable dielectric may be deposited over the first layer of dielectric material 102a and the interconnect line 120. A suitable planarization process, for example, chemical mechanical planarization, may be used to planarize a surface 250 of the second layer of dielectric material 102b. The first 102a and second 102b layers of dielectric material may be referred to as dielectric material 102. Interconnect vias 106 may be formed in the dielectric material 102 and over the interconnect metals 208 and 208b. The formation of the interconnect vias 106 of the electronic device 200 may be like the formation of the interconnect vias 106 of the electronic device 100 shown in FIG. 10 except that the interconnect vias 106 are formed on the interconnect metals 208 and 208b.

The fabrication process may continue to form the electronic device 200 shown in FIG. 2. The surface 250 of the dielectric material 102 is shown as facing down in FIG. 2. To form the electronic device 200 shown in FIG. 2, bond pads 126 may be formed on the surface 250 of the dielectric material 102 and on the vias 106. Package contacts 128 may be formed on the bond pads 126. The formation of the bond pads 126 and package contacts 128 of the electronic device 200 may be like the formation of the bond pads 126 and package contacts 128, respectively, of the electronic device 100 shown in FIG. 1.

Figure 15:
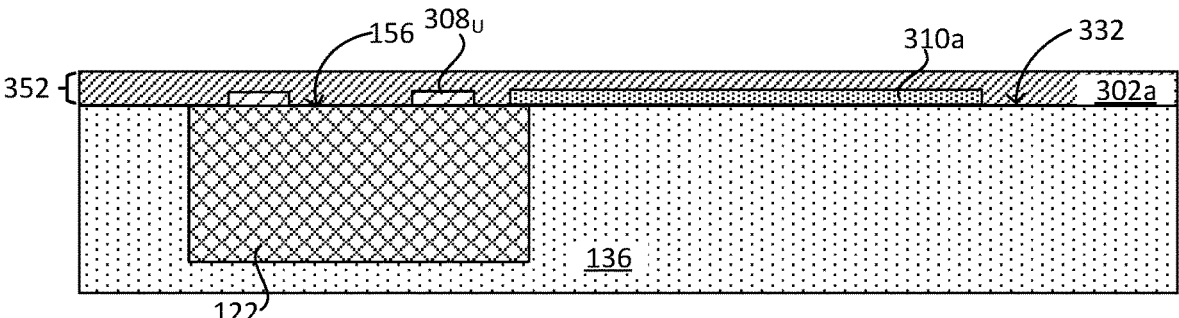
FIGS. 15 to 20 show a fabrication process flow for the electronic device shown in FIG. 3, according to some embodiments of the disclosure.

FIGS. 15 to 20 show a fabrication process flow for the electronic device 300 shown in FIG. 3, according to some embodiments of the disclosure. FIG. 15 shows an electronic device 300 at an exemplary processing step, after the formation of a molding material 136, upper interconnect metals 308u, a first conductive plate 310a of a galvanic capacitor 310 and a first layer of dielectric material 302a, according to an embodiment of the disclosure. Referring to FIG. 15, a first chip 122 may be provided. A bottom surface 156 of the first chip 122 may be attached to a tape. A molding material 136 may be formed over the side and top surfaces of the first chip 122. The tape may subsequently be removed. The bottom surfaces 332 and 156 of the molding material 136 and the first chip 122, respectively, are shown as facing up in FIGS. 15 to 20.

An interposer 352 may be formed over the bottom surfaces 332 and 156 of the molding material 136 and the first chip 122, respectively. The interposer 352 may include at least a first layer of dielectric material 302a and upper interconnect metals 308u. The upper interconnect metals 308u may be formed on the bottom surface 156 of the first chip 122 while the first conductive plate 310a of a galvanic capacitor 310 may be formed on the bottom surface 332 of the molding material 136 and at least a portion of the first chip 122. A layer of a suitable metal, for example, titanium nitride, aluminum, copper, or any other suitable metal may be deposited on the bottom surfaces 156 and 332 of the first chip 122 and the molding material 136, respectively. The titanium nitride layer may be patterned by a material removal process. A layer of photoresist may be deposited on the titanium nitride layer and subsequently exposed and developed to form suitable photoresist patterns. A wet or dry etch process may be used to remove a portion of the titanium nitride layer not covered by the photoresist patterns, leaving behind another portion of the titanium nitride layer under the photoresist patterns. The photoresist patterns may subsequently be removed. The first layer of dielectric material 302a may be formed on the bottom surfaces 332 and 156 of the molding material 136 and the first chip 122, respectively, and on the upper interconnect metals 308u and the first conductive plate 310a. A layer of a suitable dielectric, for example, silicon dioxide, silicon nitride, or any other suitable dielectric, may be deposited on the bottom surfaces 332 and 156 of the molding material 136 and the first chip 122, respectively, the upper interconnect metals 308u and the first conductive plate 310a followed by a suitable planarization process, for example, chemical mechanical planarization.

Figure 16:
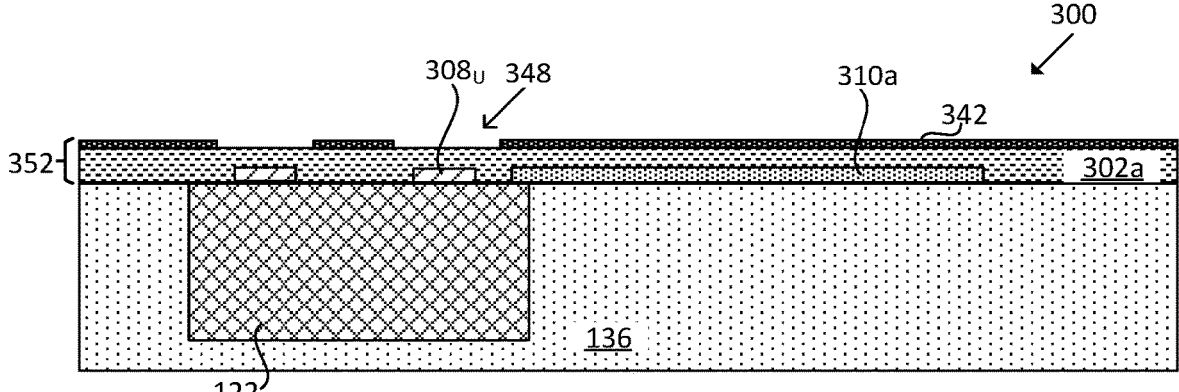

FIG. 16 shows an electronic device 300 at a subsequent processing step, after the formation of a dielectric liner 342 and openings 348 in the dielectric liner 342, according to an embodiment of the disclosure. The formation of the dielectric liner 342 may include depositing a layer of silicon nitride on the first layer of dielectric material 302*a*. The silicon nitride layer may be deposited by a suitable deposition process, for example, atomic layer deposition, chemical vapor deposition, physical vapor deposition or any other suitable deposition processes. The dielectric liner 342 is an optional layer and may be used for an etch stop layer or a chemical mechanical planarization process stop layer. Portions of the dielectric liner 342 directly above the upper interconnect metals 308*u* may be removed to form openings 348 in the dielectric liner 342. The openings 348 may be formed by a suitable material removal process. A layer of photoresist may be deposited on the dielectric liner 342 and subsequently exposed and developed to form suitable photoresist patterns. A wet etch or dry etch process may be used to remove a portion of the dielectric liner 342 not covered by the photoresist patterns to form the openings 348. The etching processes may leave behind another portion of the dielectric liner 342 under the photoresist patterns. The photoresist patterns may subsequently be removed.

Figure 17:
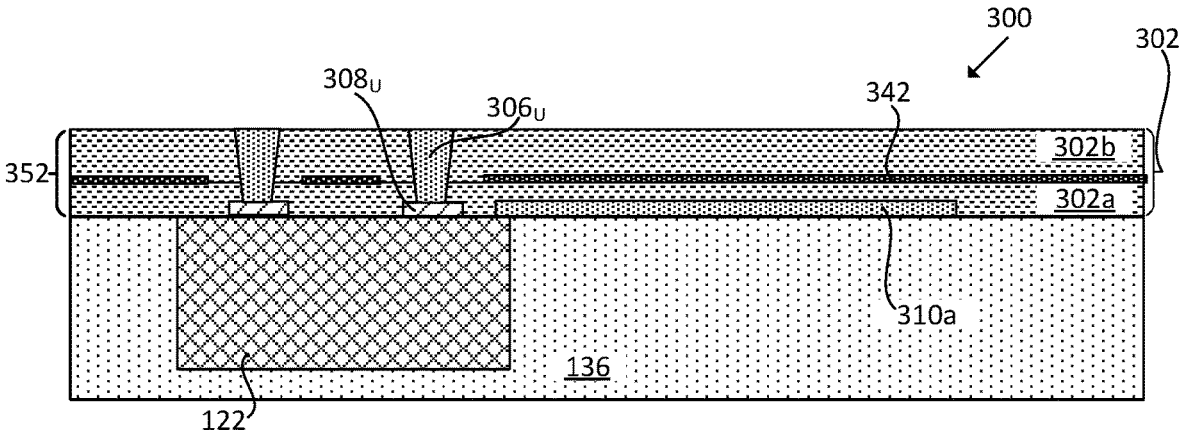

FIG. 17 shows an electronic device 300 at a subsequent processing step, after the formation of a second layer of dielectric material 302*b* and upper interconnect vias 306*u*, according to an embodiment of the disclosure. The second layer of dielectric material 302*b* and upper interconnect vias 306*u* may form part of the interposer 352. A layer of a suitable dielectric material, for example, silicon dioxide, silicon nitride, or any other suitable dielectric material may be deposited over the dielectric liner 342 and the first layer of dielectric material 302*a*. A planarization process, for example, chemical mechanical planarization, may be used to planarize the silicon dioxide layer. The first 302*a* and second 302*b* layers of dielectric material may be referred to as dielectric material 302. Upper interconnect vias 306*u* may be formed in the dielectric material 302 and over the upper interconnect metals 308*u*. The formation of the upper interconnect vias 306*u* may include forming openings in the dielectric material 302 by a material removal process. A layer of photoresist may be deposited on the dielectric material 302 and subsequently exposed and developed to form suitable photoresist patterns. A wet etch or dry etch process may be used to remove a portion of the dielectric material 302 not covered by the photoresist patterns to form the openings. The openings may expose a portion of the upper interconnect metals 308*u*. The etching processes may leave behind another portion of the dielectric material 302 under the photoresist patterns. The photoresist patterns may subsequently be removed. A layer of a suitable metal, for example, tungsten, aluminum, copper, or any other suitable metal, may be deposited in the openings. A suitable planarization process, for example, chemical mechanical planarization, may be used to remove a portion of the tungsten layer from a top surface of the dielectric material 302, leaving behind another portion of the tungsten layer in the openings.

Figure 18:
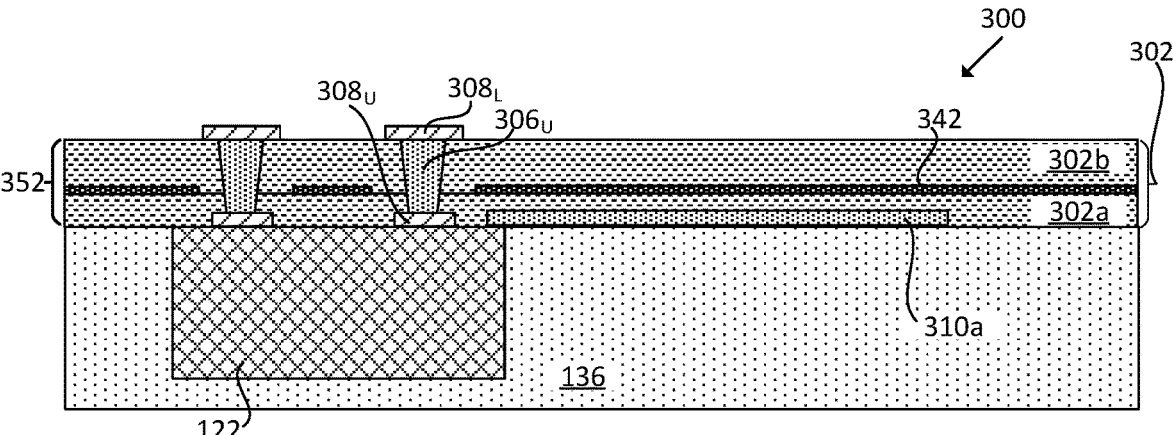

FIG. 18 shows an electronic device 300 at a subsequent processing step, after the formation of lower interconnect metals 308L, according to an embodiment of the disclosure. The lower interconnect metals 308L may form part of the interposer 352 and may be formed over the upper interconnect vias 306*u*. A layer of a suitable metal, for example, titanium nitride, aluminum, copper, or any other suitable metal may be deposited on the second layer of dielectric material 302*b* and upper interconnect vias 306*u*. The titanium nitride layer may be patterned by a material removal process. A layer of photoresist may be deposited on the titanium nitride layer and subsequently exposed and developed to form suitable photoresist patterns. A wet etch or dry etch process may be used to remove a portion of the titanium nitride layer not covered by the photoresist patterns, leaving behind another portion of the titanium nitride layer under the photoresist patterns. The photoresist patterns may subsequently be removed.

Figure 19:
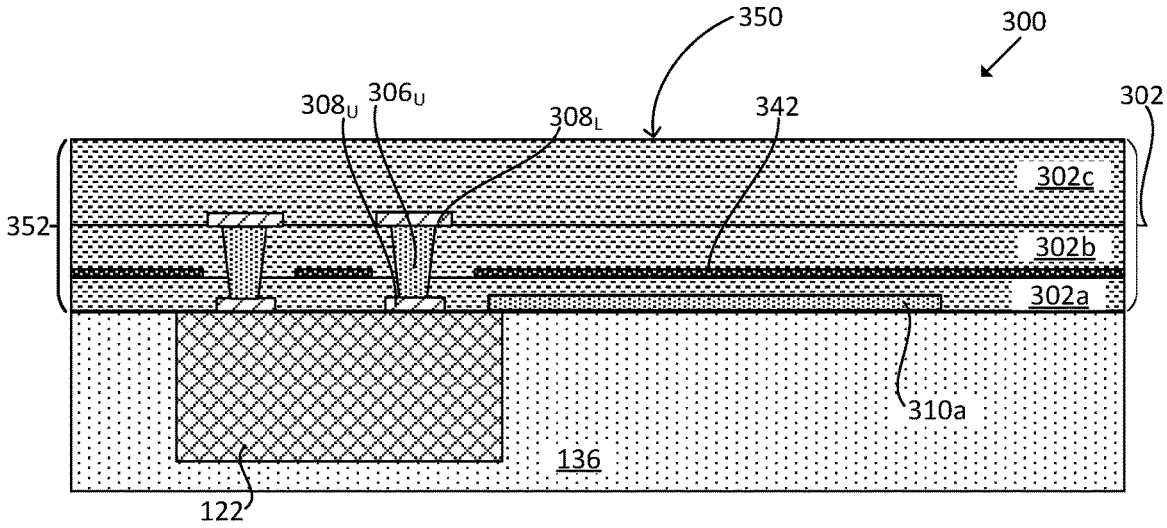

FIG. 19 shows an electronic device 300 at a subsequent processing step, after the formation of a third layer of dielectric material 302*c*, according to an embodiment of the disclosure. The third layer of dielectric material 302*c* may form part of the interposer 352. A layer of a suitable dielectric material, for example, silicon dioxide, silicon nitride or any other suitable dielectric material may be deposited over the second layer of dielectric material 302*b* and the lower interconnect metals 308L. A suitable planarization process, for example, chemical mechanical planarization, may be used to planarize a surface 350 of the third layer of dielectric material 302*c*. The first 302*a*, second 302*b* and third 302*c* layers of dielectric material may be referred to as dielectric material 302.

Figure 20:
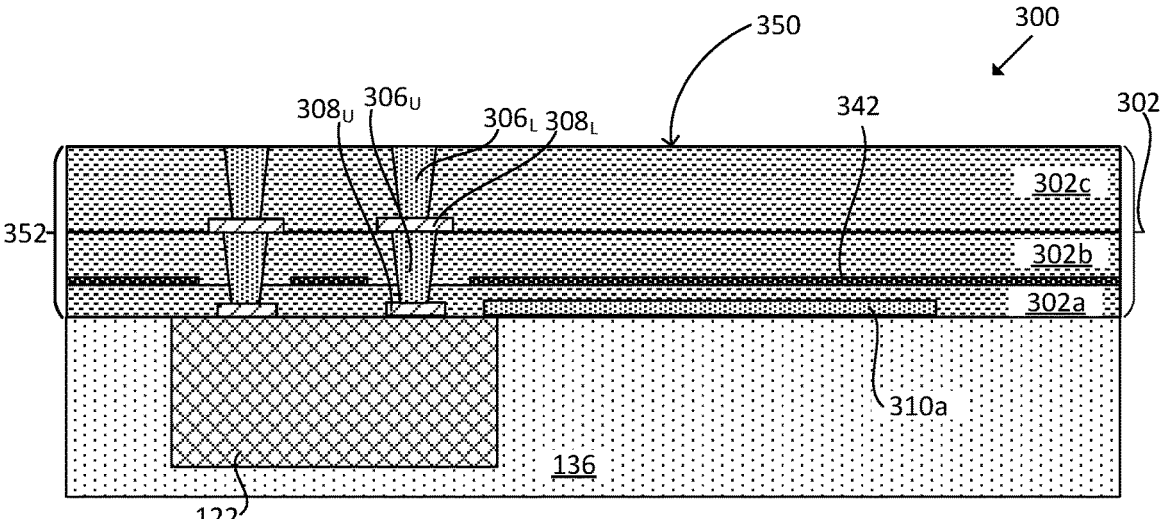

FIG. 20 shows an electronic device 300 at a subsequent processing step, after the formation of lower interconnect vias 306L, according to an embodiment of the disclosure. The lower interconnect vias 306L may form part of the interposer 352 and may be formed in the dielectric material 302 and over the lower interconnect metals 308L. Openings may be made in the dielectric material 302 by a material removal process. A layer of photoresist may be deposited on the surface 350 of the dielectric material 302 and subsequently exposed and developed to form suitable photoresist patterns. A wet etch or dry etch process may be used to remove a portion of the dielectric material 302 not covered by the photoresist patterns to form the openings. The etching processes may leave behind another portion of the dielectric material 302 under the photoresist patterns. The photoresist patterns may subsequently be removed. The openings may expose a portion of the lower interconnect metals 308L. A layer of a suitable metal, for example, tungsten, aluminum, copper, or any other suitable metal may be deposited in the openings and on the surface 350 of the dielectric material 302. A suitable planarization process, for example, chemical mechanical planarization, may be used to remove a portion of the tungsten layer from the surface 350 of the dielectric material 302, leaving behind another portion of the tungsten layer in the openings.

The fabrication process may continue to form the device 300 shown in FIG. 3. The surface 350 of the dielectric material 302 is shown as facing down in FIG. 3. Bond pads 126 and the second conductive plate 310*b* may be formed simultaneously. A layer of a suitable metal, for example, titanium nitride, may be deposited on the surface 350 of the dielectric material 302. The titanium nitride layer may be patterned by a material removal process. A layer of photoresist may be deposited on the titanium nitride layer and subsequently exposed and developed to form suitable photoresist patterns. A wet etch or dry etch process may be used to remove a portion of the titanium nitride layer not covered by the photoresist patterns. The etching processes may leave behind another portion of the titanium nitride layer under the photoresist patterns to form the second conductive plate 310*b* and bond pads 126. The photoresist patterns may subsequently be removed. The bond pads 126 may be formed over the lower interconnect vias 306L. One of the bond pads 126 may also be coupled to the second conductive plate 310*b*. The second conductive plate 310*b* may be laterally spaced from bond pads 126 coupled to the lower interconnect vias 306L. Package contacts 128 may be formed below the bond pads 126. The formation of the package contacts 128 of the electronic device 300 may be like the formation of the package contacts 128 of the electronic device 100 shown in FIG. 1.

Figure 21:
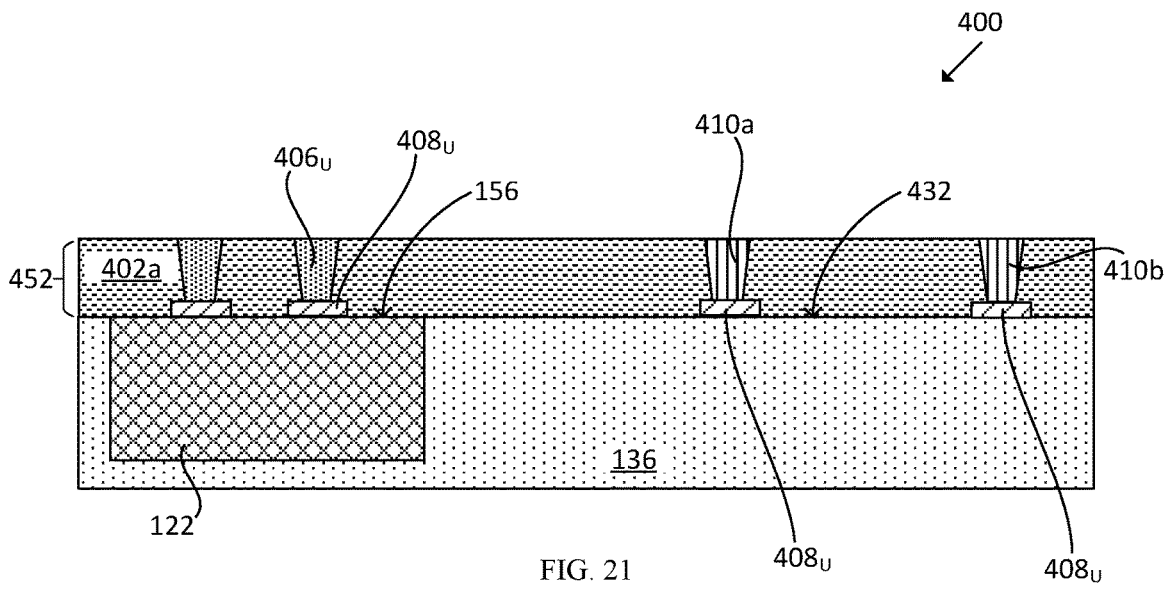
FIGS. 21 to 23 show a fabrication process flow for the electronic device shown in FIG. 4, according to some embodiments of the disclosure For simplicity and clarity of illustration, the drawings illustrate the general manner of construction, and certain descriptions and details of well-known features and techniques may be omitted to avoid unnecessarily obscuring the discussion of the described embodiments of the devices. Additionally, elements in the drawings are not necessarily drawn to scale. For example, the dimensions of some of the elements in the drawings may be exaggerated relative to other elements to help improve understanding of embodiments of the devices. The same reference numerals in different drawings denote the same elements, while similar reference numerals may, but do not necessarily, denote similar elements.
Figure 22:
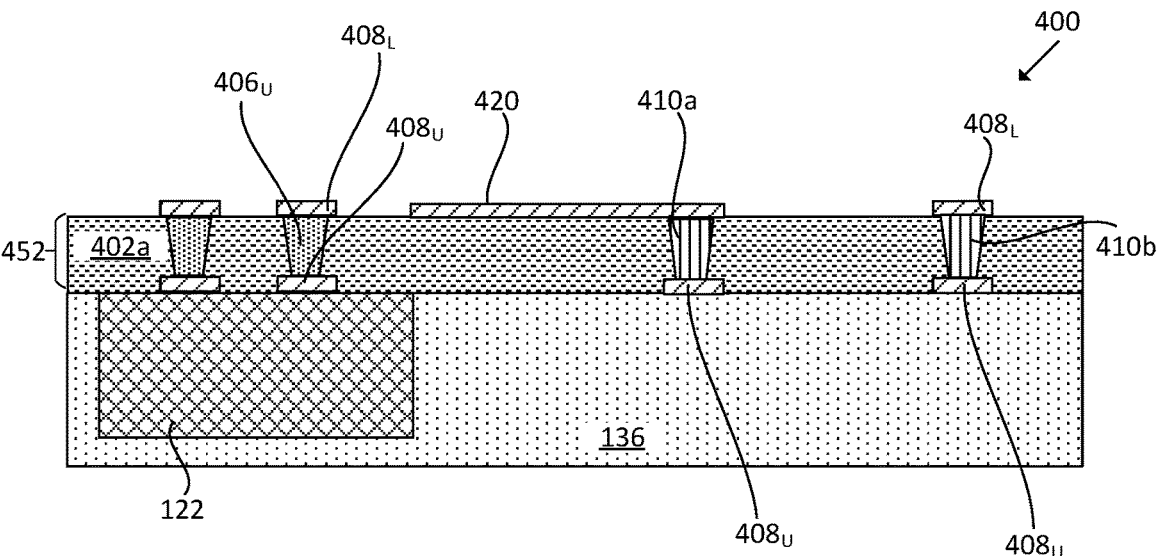
Figure 23:
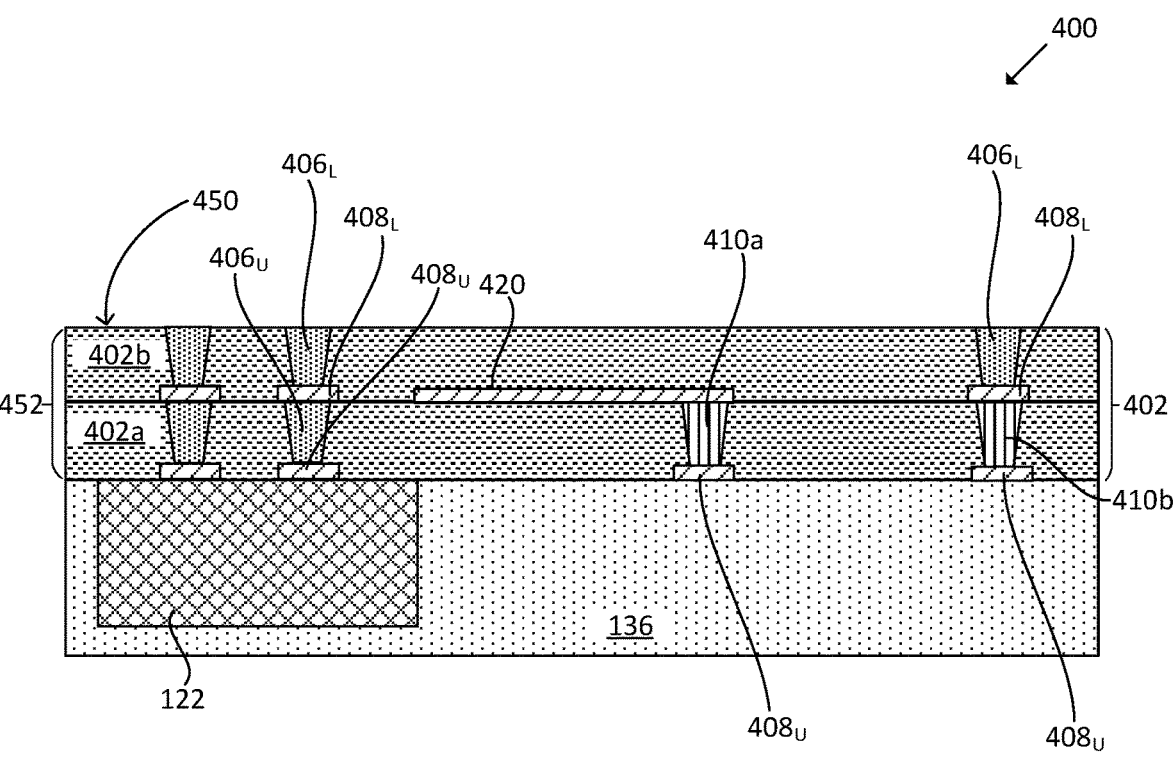

FIGS. 21 to 23 show a fabrication process flow for the electronic device 400 shown in FIG. 4, according to some embodiments of the disclosure. FIG. 21 shows an electronic device 400 at an exemplary processing step, for example, after formation of a molding material 136, a first layer of dielectric material 402a, upper interconnect metals 408u, first 410a and second 410b via bars of a galvanic capacitor 410, and upper interconnect vias 406u, according to an embodiment of the disclosure. Referring to FIG. 21, a first chip 122 may be provided. A tape may be attached to a bottom surface 156 of the first chip 122. The bottom surface 156 of the first chip 122 is shown as facing up in FIGS. 21 to 23. A molding material 136 may be formed over the side and upper surfaces of the first chip 122 and the tape subsequently removed.

An interposer 452 may be formed over the bottom surfaces 156 and 432 of the first chip 122 and the molding material 136, respectively. The interposer 452 may include at least the first layer of dielectric material 402a, upper interconnect metals 408u and upper interconnect vias 406u. The upper interconnect metals 408u may be formed on the bottom surface 156 of the first chip 122 and on the molding material 136. The formation of the upper interconnect metals 408u may be like the formation of the upper interconnect metals 308u shown in FIG. 15 except that upper interconnect metals 408u may also be formed on the molding material 136. A first layer of dielectric material 402a may be formed over the upper interconnect metals 408u and bottom surfaces 156 and 432 of the first chip 122 and molding material 136, respectively. A layer of a suitable dielectric material, for example, silicon dioxide, silicon nitride or any other suitable dielectric material may be deposited on the upper interconnect metals 408u, the first chip 122 and the molding material 136. A suitable planarization process, for example, chemical mechanical planarization, may be used to planarize the first layer of dielectric material 402a.

The first 410a and second 410b via bars of the galvanic capacitor 410 may be formed in the first layer of dielectric material 402a and on the upper interconnect metals 408u over the molding material 136. For example, the first via bar 410a may be formed on the upper interconnect metal 408u over the molding material 136 and spaced from the first chip 122. The second via bar 410b may be formed on another upper interconnect metal 408u over the molding material 136. The formation of the first 410a and second 410b via bars may include forming openings the first layer of dielectric material 402a with a material removal process. A layer of photoresist may be deposited on the surface of the first layer of dielectric material 402a and subsequently exposed and developed to form suitable photoresist patterns. A wet etch or dry etch process may be used to remove a portion of the first layer of dielectric material 402a not covered by the photoresist patterns, leaving behind another portion of the first layer of dielectric material 402a under the photoresist patterns. The photoresist patterns may subsequently be removed. The openings may expose a portion of the upper interconnect metals 408u on the molding material 136. A layer of a suitable metal, for example, tungsten, aluminum, copper, or any other suitable metal, may be deposited in the openings. A suitable planarization process, for example, chemical mechanical planarization, may be used to remove a portion of the tungsten layer from the surface of the first layer of dielectric material 402a, leaving behind another portion of the tungsten layer in the openings.

Upper interconnect vias 406u may be formed in the first layer of dielectric material 402a and over the upper interconnect metals 408u on the first chip 122. The formation of the upper interconnect vias 406u may be like the formation of the upper interconnect vias 306u shown in FIG. 17 except that the upper interconnect vias 406u are formed in the first layer of dielectric material 402a and on the upper interconnect metals 408u.

FIG. 22 shows an electronic device 400 at a subsequent processing step, after the formation of an interconnect line 420 and lower interconnect metals 408L, according to an embodiment of the disclosure. The interconnect line 420 may form part of the interposer 452 and may be formed on the first via bar 410a and the first layer of dielectric material 402a. The lower interconnect metals 408L may also form part of the interposer 452 and may be formed on the upper interconnect vias 406u. One of the lower interconnect metals 408L may also be formed on the second via bar 410b. A layer of a suitable metal, for example, titanium nitride, aluminum, copper, or any other suitable metal may be deposited on the first layer of dielectric material 402a, first 410a and second 410b via bars, and over the upper interconnect vias 406u. The titanium nitride layer may be patterned by a suitable material removal process. A layer of photoresist may be deposited on the titanium nitride layer and subsequently exposed and developed to form suitable photoresist patterns. A wet etch or dry etch process may be used to remove a portion of the titanium nitride layer not covered by the photoresist patterns, leaving behind another portion of the titanium nitride layer under the photoresist patterns. The photoresist patterns may subsequently be removed.

FIG. 23 shows an electronic device 400 at a subsequent processing step, after the formation of a second layer of dielectric material 402b and lower interconnect vias 406L, according to an embodiment of the disclosure. A layer of a suitable dielectric material, for example, silicon dioxide, silicon nitride or any other suitable dielectric material may be deposited over the first layer of dielectric material 402a, lower interconnect metals 408L and interconnect line 420. A suitable planarization process, for example, chemical mechanical planarization, may be used to planarize a surface 450 of the second layer of dielectric material 402b. The first 402a and second 402b layers of dielectric material may be referred to as dielectric material 402. The second layer of dielectric material 402b and lower interconnect vias 406L may also form part of the interposer 452. Lower interconnect vias 406L may be formed in the dielectric material 402 and arranged over the lower interconnect metals 408L coupled to the upper interconnect vias 406u. Another lower interconnect via 406L may also be formed on the lower interconnect metal 408L coupled to the second via bar 410b.

The fabrication process may continue to form the electronic device 400 shown in FIG. 4. The surface 450 of the dielectric material 402 is shown as facing down. To form the electronic device 400 shown in FIG. 4, a bond pad 126 may be formed below the lower interconnect via 406L coupled to the second via bar 410b. Bond pads 126 may also be formed below the lower interconnect vias 406L coupled to the first chip 122 and on the surface 450 of the dielectric material 402. Package contacts 128 may be formed below the bond pads 126. The formation of the bond pads 126 of the electronic device 400 may be like the formation of the bond pads 126 shown in FIG. 1, except that the bond pads 126 are formed below the lower interconnect via 406L coupled to the second via bar 410*b*, lower interconnect vias 406L coupled to the first chip 122 and on the surface 450 of the dielectric material 402. The formation of the package contacts 128 of the electronic device 400 may be like the formation of package contacts 128 shown in FIG. 1.

The electronic devices 100 to 400 may provide cost effective galvanic isolation in a fan-out package. The devices 100 to 400 are compact in size and may be fabricated with standard manufacturing processes.

The terms "first", "second", "third", and the like in the description and in the claims, if any, are used for distinguishing between similar elements and not necessarily for describing a particular sequential or chronological order. It is to be understood that the terms so used are interchangeable under appropriate circumstances such that the embodiments of the device described herein are, for example, capable of operation in sequences other than those illustrated or otherwise described herein. The terms "left", "right", "front", "back", "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements but may include other elements not expressly listed or inherent to such process, method, article, or device.

While several exemplary embodiments have been presented in the above detailed description of the device, it should be appreciated that number of variations exist. It should further be appreciated that the embodiments are only examples, and are not intended to limit the scope, applicability, dimensions, or configuration of the devices in any way. Rather, the above detailed description will provide those skilled in the art with a convenient road map for implementing an exemplary embodiment of the devices, it being understood that various changes may be made in the function and arrangement of elements and method of fabrication described in an exemplary embodiment without departing from the scope of this disclosure as set forth in the appended claims.

What is claimed is:

1. An electronic device comprising:
an interposer including a dielectric material and an interconnect structure;
an integrated circuit chip over the interposer;
a galvanic capacitor spaced from the integrated circuit chip, the galvanic capacitor having a first electrode and a second electrode, and the first electrode of the galvanic capacitor is coupled to the integrated circuit chip; and
a molding material over the integrated circuit chip and the galvanic capacitor, wherein the integrated circuit chip is spaced from the galvanic capacitor by at least a portion of the molding material, wherein the first electrode of the galvanic capacitor is a first conductive plate and the second electrode of the galvanic capacitor is a second conductive plate arranged below the first conductive plate and at least partially underlapping the first conductive plate, the first conductive plate is arranged over and external to the interposer, and the second conductive plate is disposed in the interposer, wherein the first conductive plate is in a second chip laterally adjacent to the integrated circuit chip, and the second conductive plate in the interposer directly contacts the second chip.

2. The electronic device of claim 1, further comprising an interconnect pillar connecting the first conductive plate to the interposer, wherein the interconnect pillar extends from a bottom surface of the first conductive plate to a top surface of the interposer.

3. The electronic device of claim 1, wherein the second conductive plate is arranged completely in the interposer and is laterally spaced from the integrated circuit chip.

4. The electronic device of claim 1, wherein the electronic device is a fan-out package.

5. The electronic device of claim 4, wherein the interconnect structure includes an interconnect via, and the interconnect via couples the second electrode of the galvanic capacitor to a package contact.

6. An electronic device comprising:
an interposer including a dielectric material and an interconnect structure;
an integrated circuit chip over the interposer;
a galvanic capacitor laterally spaced from the integrated circuit chip, the galvanic capacitor having a first electrode and a second electrode, and the first electrode of the galvanic capacitor is electrically coupled to the integrated circuit chip; and
a molding material over the integrated circuit chip and the galvanic capacitor, wherein the integrated circuit chip is spaced from the galvanic capacitor by at least a portion of the molding material,
wherein the first electrode of the galvanic capacitor is a first conductive plate and the second electrode of the galvanic capacitor is a second conductive plate arranged below the first conductive plate and at least partially underlapping the first conductive plate, the first conductive plate is arranged over and external to the interposer, and the second conductive plate is disposed in the interposer, wherein the first conductive plate is in a second chip on the interposer and laterally adjacent to the integrated circuit chip, and the second conductive plate in the interposer directly contacts the second chip.

7. A method of fabricating an electronic device comprising:
forming a molding material over an integrated circuit chip;
forming a galvanic capacitor, the galvanic capacitor having a first electrode and a second electrode, the first electrode of the galvanic capacitor is coupled to the integrated circuit chip, and the galvanic capacitor is spaced from the integrated circuit chip by at least a portion of the molding material; and
forming an interposer including a dielectric material and an interconnect structure, wherein the interposer is below the integrated circuit chip,
wherein the first electrode of the galvanic capacitor is a first conductive plate and the second electrode of the galvanic capacitor is a second conductive plate formed below the first conductive plate and at least partially underlapping the first conductive plate, the first conductive plate is formed over and external to the interposer, and the second conductive plate is formed in the interposer, wherein the first conductive plate is formed in a second chip, the second chip is disposed laterally adjacent to the integrated circuit chip, and the second conductive plate in the interposer directly contacts the second chip.

8. The electronic device of claim 1, wherein a surface of the second conductive plate and a top surface of the interposer is substantially coplanar.

9. The electronic device of claim 2, wherein the first conductive plate is a single layer and the interconnect pillar extends continuously from the bottom surface of the first conductive plate and through the second chip to a bottom surface of the second chip.

10. The electronic device of claim 9, wherein a portion of the dielectric material of the interposer surrounds the second conductive plate and contacts the bottom surface of the second chip.

11. The electronic device of claim 9, wherein the second chip is surrounded by the molding material.

12. The electronic device of claim 2, wherein the interconnect structure includes an interconnect metal, an interconnect feature, and an interconnect line, wherein the interconnect metal is arranged below the interconnect pillar and the interconnect line is coupled to the interconnect metal by the interconnect feature.

13. The electronic device of claim 12, wherein the second conductive plate is laterally spaced from the interconnect metal by a portion of the dielectric material of the interposer.

14. The electronic device of claim 1, wherein the interconnect structure includes an interconnect via underlapping the second conductive plate, and the interconnect via couples the second conductive plate to a package contact disposed on a bond pad on the interposer.

15. The electronic device of claim 14, wherein the second conductive plate is a single layer and the interconnect via extends continuously from the second conductive plate and through the dielectric material of the interposer to contact the bond pad below the dielectric material of the interposer.

16. The electronic device of claim 14, wherein the interconnect structure further includes an interconnect metal and a second interconnect via underlapping the integrated circuit chip, and the second interconnect via couples the integrated circuit chip to another package contact.

17. The electronic device of claim 16, wherein the second interconnect via extends from the interconnect metal and through the dielectric material of the interposer to contact another bond pad below the dielectric material of the interposer.

* * * * *